(12) United States Patent
Gäbler

(10) Patent No.: US 12,125,862 B2
(45) Date of Patent: Oct. 22, 2024

(54) OPTICAL SENSOR COMPRISING A PHOTODIODE ARRAY

(71) Applicant: Daniel Gäbler, Apolda (DE)

(72) Inventor: Daniel Gäbler, Apolda (DE)

(73) Assignee: X-FAB GLOBAL SERVICES GMBH, Erfurt (DE)

( * ) Notice: Subject to any disclaimer, the term of this patent is extended or adjusted under 35 U.S.C. 154(b) by 281 days.

(21) Appl. No.: 17/333,969

(22) Filed: May 28, 2021

(65) Prior Publication Data

US 2021/0375968 A1 Dec. 2, 2021

(30) Foreign Application Priority Data

Jun. 2, 2020 (GB) .................................. 2008270.7

(51) Int. Cl.
*H01L 27/146* (2006.01)
(52) U.S. Cl.
CPC .. *H01L 27/14623* (2013.01); *H01L 27/14636* (2013.01); *H01L 27/14643* (2013.01); *H01L 27/14685* (2013.01); *H01L 27/14689* (2013.01)
(58) Field of Classification Search
CPC .................... H01L 27/14623; H01L 27/14636
See application file for complete search history.

(56) References Cited

U.S. PATENT DOCUMENTS

| 5,517,029 | A | 5/1996 | Yanka et al. |
| 6,410,940 | B1 | 6/2002 | Jiang et al. |
| 6,504,188 | B1 * | 1/2003 | Maruyama ........ H01L 27/14843 |
| | | | 257/E27.152 |
| 7,446,359 | B2 * | 11/2008 | Lee .................... H01L 27/14687 |
| | | | 257/292 |
| 7,683,407 | B2 * | 3/2010 | Boettiger .......... H01L 27/14629 |
| | | | 257/292 |
| 7,973,271 | B2 * | 7/2011 | Toumiya ........... H01L 27/14685 |
| | | | 250/214 R |
| 8,237,832 | B2 * | 8/2012 | Nozaki ............. H01L 27/14627 |
| | | | 257/292 |
| 9,123,609 | B2 * | 9/2015 | Fukuda ............... H01L 27/1464 |

(Continued)

FOREIGN PATENT DOCUMENTS

| CN | 101064326 | 10/2007 |
| CN | 101132014 | 2/2008 |

(Continued)

OTHER PUBLICATIONS

GB, Intellectual Property Office; Search Report; GB patent application serial No. GB2008270.7; 5 pages (Oct. 21, 2020).

(Continued)

*Primary Examiner* — Mounir S Amer
*Assistant Examiner* — Alexander Belousov
(74) *Attorney, Agent, or Firm* — Thompson Hine LLP

(57) ABSTRACT

An optical sensor including an array of photodiodes having a first and a second photodiode, each having an optical active region and a peripheral region. The sensor further includes a metal layer having a plurality of metal wires located in the peripheral regions of the first and second photodiodes, wherein the first photodiode is connected to a first subset of metal wires of the plurality of metal wires and wherein the second photodiode is connected to a second, different subset of metal wires of the plurality of metal wires.

12 Claims, 4 Drawing Sheets

(56) References Cited

U.S. PATENT DOCUMENTS

| | | | |
|---|---|---|---|
| 10,431,626 B2* | 10/2019 | Chen | H01L 27/14623 |
| 11,362,223 B2* | 6/2022 | Chen | H01L 31/02327 |
| 11,605,742 B2* | 3/2023 | Gäbler | H01L 27/14623 |
| 2005/0122418 A1 | 6/2005 | Okita et al. | |
| 2005/0285215 A1* | 12/2005 | Lee | H01L 27/14603 |
| | | | 257/432 |
| 2009/0065821 A1 | 3/2009 | Lee | |
| 2009/0213248 A1 | 8/2009 | Chan | |
| 2011/0072568 A1 | 3/2011 | Maercovich et al. | |
| 2012/0098081 A1 | 4/2012 | Horiike et al. | |
| 2018/0357464 A1 | 12/2018 | Wang et al. | |
| 2021/0375968 A1* | 12/2021 | Gäbler | H01L 27/14643 |
| 2021/0399149 A1* | 12/2021 | Gäbler | H01L 27/1463 |

FOREIGN PATENT DOCUMENTS

| | | | |
|---|---|---|---|
| JP | 2012084687 A | * | 4/2012 |
| KR | 20060000061 A | * | 1/2006 |

OTHER PUBLICATIONS

Gäbler et al., CMOS integrated UV-Photodiodes, $30^{th}$ Eurosensors Conference, Sep. 2017, Hungary, Procedia Engineering 168 (2016), pp. 1208-1213.

China National Intellectual Property Administration, First Office Action issued Jun. 28, 2024, which pertains to Chinese Patent Application No. 2021106168735. 12 pgs.

German Patent Office, First Office Action issued Jul. 2, 2024, which pertains to German Patent No. 10 2021 113 928.7. 19 pgs.

* cited by examiner

OPTICAL SENSOR COMPRISING A PHOTODIODE ARRAY

This application claims priority to United Kingdom patent application no. GB2008270.7, filed on Jun. 2, 2020 and entitled OPTICAL SENSOR COMPRISING A PHOTODIODE ARRAY, the entire contents of which are hereby incorporated by reference.

TECHNICAL FIELD

The invention concerns optical sensors comprising an array of photodiodes.

BACKGROUND

An optical sensor can comprise an array of photodiodes for detecting incoming light. Each photodiode has an optical active area in the center surrounded by a periphery for wiring. To avoid crosstalk between photodiodes, the optical sensor can include a light shield in the periphery. The closer the light shield is located to the photodiode, the more effective it is.

SUMMARY

Aspects of the present invention provide an optical sensor and a method for use in making an optical sensor as set out in the appended claims.

Certain embodiments of the invention will now be described with reference to the accompanying drawings.

DETAILED DESCRIPTION

A problem with optical sensors is the need to shield the periphery (i.e. the peripheral region surrounding the optical active region at the center of the photodiode) of each photodiode from incident light. A light shield (i.e. a light dense structure) can be provided in one of the metal layers. The closer to the silicon the light shield is located, the better the shielding effect. However, in an array of photodiodes Metal 1 (i.e. the lowermost metal layer of the backend stack) needs to be used for wiring for connecting to the photodiodes. Hence, Metal 2 (i.e. the second lowermost metal layer of the backend stack) is the metal layer closest to the silicon that can be used to provide a light shield. Since the light shield needs to be light dense (no holes are allowed), electrical signals cannot be routed to or from the photodiodes above the light shield. If the light shield is located in Metal 2, then no signals from Metal 3 or above can be routed to the photodiodes.

Figure 1:
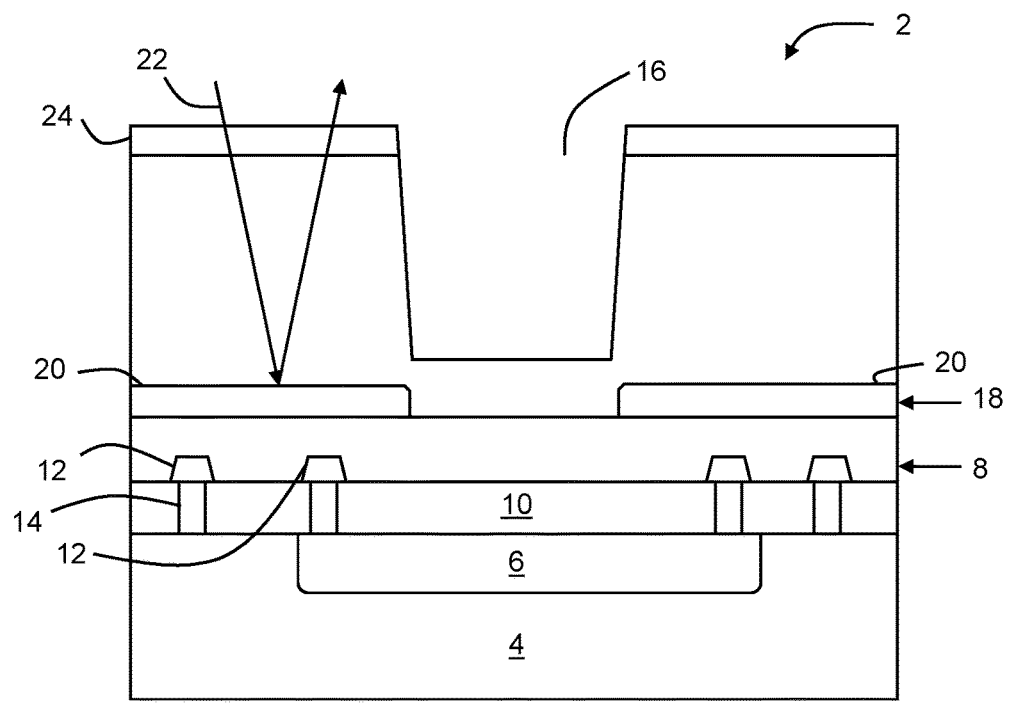
FIG. 1 shows a schematic cross section of a photodiode in an optical sensor.

FIG. 1 shows a schematic cross section of a photodiode 2. The photodiode 2 comprises a substrate 4 comprising an optical active region 6 defined by doped regions providing one or more pn-junctions for converting incident light into electrical signals. The first metal layer 8 (Metal 1) is separated from the substrate 4 by an interdielectric layer 10 (e.g. comprising silicon oxide). The first metal layer 8 comprises a plurality of metal wires 12 for connecting to the photodiode 2. Contacts 14 connect to the wires 12 to output the electrical signals. The photodiode 2 further comprises an ultraviolet (UV) window 16 for receiving incident light into optical active region 6. The second metal layer 18 (Metal 2) comprises a light shield 20 for blocking light 22 incident on the peripheral region of the photodiode 2. There may be further metal layers (e.g. Metal 3) not shown. A passivation layer 24 (e.g. a silicon nitride layer) covers the backend stack, apart from in the UV window 16.

Wiring of the electrical signals of multiple different photodiodes should be achieved in a single metal layer (no crossing possible). Thus, all signals of a row or column in an array of photodiodes must pass through all photodiodes of that row or column. For example, in a 4×4 array, each row or column may need to carry four different signals.

Figure 2:
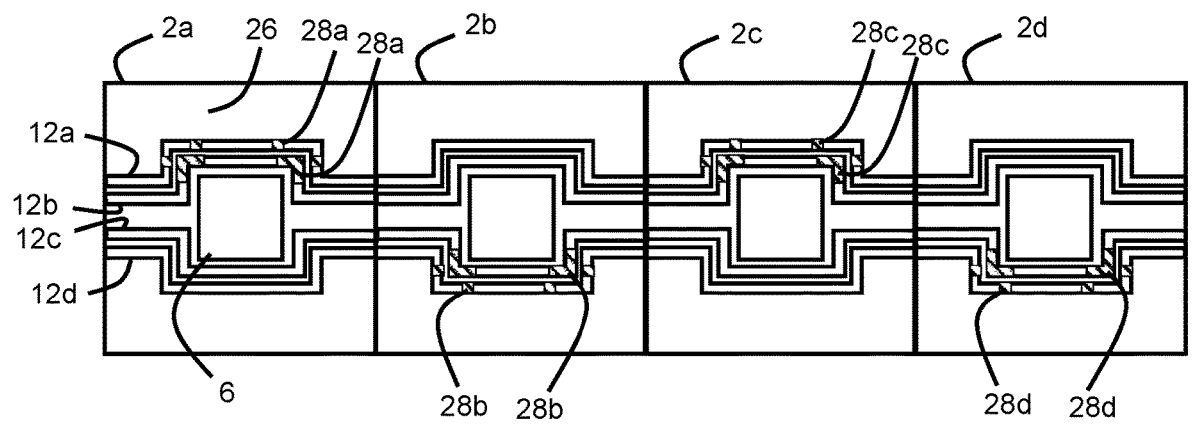
FIG. 2 shows a schematic top view cross section of a part of an optical sensor according to an embodiment having a row of four photodiodes.

FIG. 2 shows a top cross sectional view of a part of an optical sensor according to an embodiment. The optical sensor comprises a row of four photodiodes 2a, 2b, 2c and 2d connected by four metal wires 12a, 12b, 12c and 12d, for providing input and output signals to the photodiodes 2a, 2b, 2c and 2d. Each photodiode 2a, 2b, 2c and 2d comprises an optical active region 6, for detecting incident light and a peripheral region 26 around the optical active region 6. The metal wires 12a, 12b, 12c and 12d run through the peripheral region 26 of each photodiode 2a, 2b, 2c and 2d in the row. The first (leftmost) photodiode 2a comprises contacts 28a in the peripheral region 26 connecting the photodiode 2a to the first and to the second metal wire 12a and 12b. The first and second metal wire 12a and 12b are similarly located in the peripheral region 26 of the second (neighboring) photodiode 2b. However, the second photodiode 2b does not comprise any contacts located so as to connect to the first and second wire 12a and 12b to the second photodiode 2b, and so any signals from or to the first photodiode 2a bypass the second photodiode 2b. The second photodiode 2b comprises contacts 28b connecting the second photodiode 2b to the third and fourth metal wire 12c and 12d, which can thereby provide input and output signals to the second photodiode 2b. The first photodiode 2a does not comprise contacts in the lower half of the peripheral region 26, and is therefore not connected to the third and fourth metal wire 12c and 12d. Hence, signals to and/or from the second photodiode 2b bypass the first photodiode 2a. Advantageously, the four metal wires are located in the same metal layer (typically Metal 1). The layout of the metal wires 12a, 12b, 12c and 12d in combination with the placement of contacts 28a and 28b of neighboring photodiodes, enables individual inputs and outputs to photodiodes 2a and 2b in a row, without having to route signals in different metal layers. Each photodiode 2a, 2b, 2c and 2d can comprise a light shield (not shown) being a light dense structure covering the peripheral region 26, whilst leaving the optical active region 6 exposed. The light shield can be located in Metal 2, which is possible when all the wiring of the photodiodes 2a, 2b, 2c and 2d is located in Metal 1.

The third photodiode $2c$ comprises contacts in the upper half of the peripheral region 26, thereby connecting to the first and second metal wires $12a$ and $12b$. The first and third diode $2a$ and $2c$ are thereby connected together, and output signals on the first and second metal wires $12a$ and $12b$ will be the sum of signals from the first and third photodiodes $2a$ and $2c$. Similarly, the fourth photodiode $2d$ comprises contacts $28d$ in the lower half of the peripheral region 26, and is connected to the third and fourth metal wire $12c$ and $12d$, so that the output on these wires is the sum of signals from the second and fourth photodiodes $2b$ and $2d$.

Figure 3:
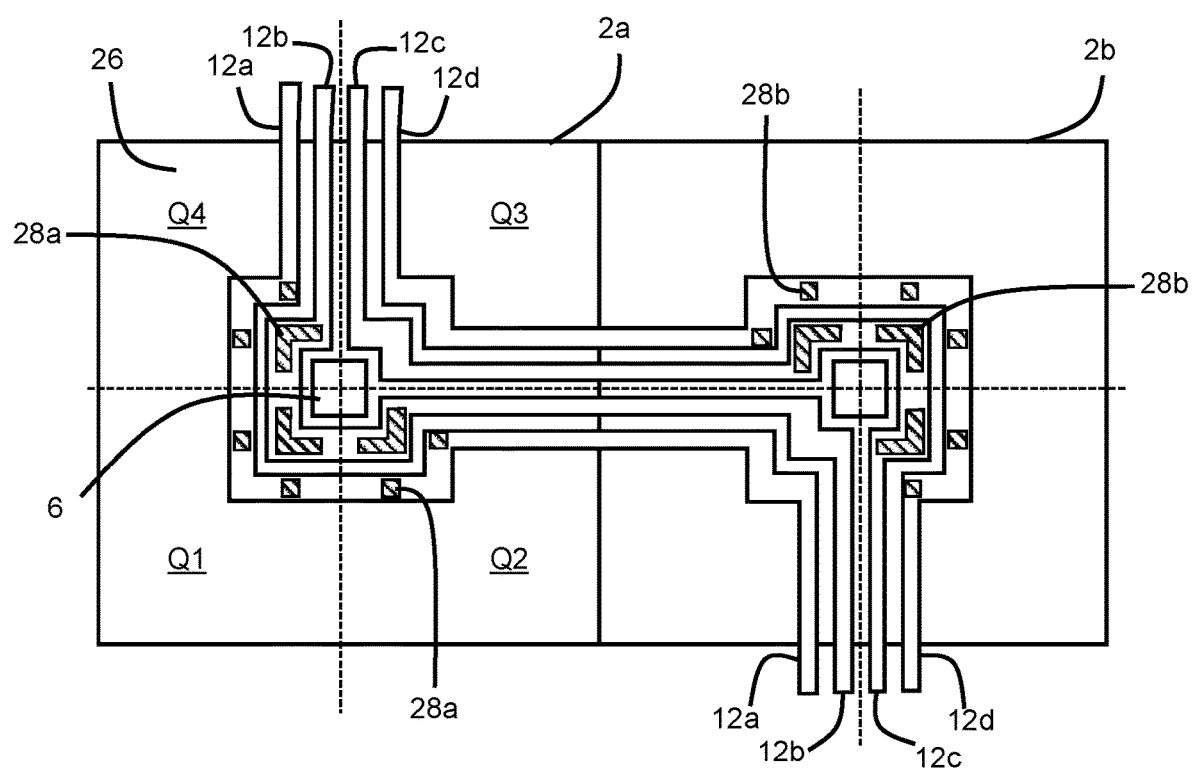
FIG. 3 shows a schematic top view cross section of a part of an optical sensor according to another embodiment.

FIG. 3 shows a top cross sectional view of two photodiodes $2a$ and $2b$ located next to each other in an optical sensor according to another embodiment. Each photodiode comprises an optical active region 6 and a peripheral region 26 surrounding the optical active region 6. Four metal wires $12a$, $12b$, $12c$ and $12d$ are located in the peripheral region 6 of both photodiodes $2a$ and $2b$. The photodiodes $2a$ and $2b$ have a substantially square shape and can be divided into four quadrants Q1, Q2, Q3 and Q4. The first photodiode $2a$ comprises contacts 28 in three quadrants being Q1, Q2 and Q4, while the second photodiode $2b$ comprises contacts in quadrants Q2, Q3 and Q4. Thereby, the first photodiode $2a$ is connected to the first and second wire $12a$ and $12b$, while the second photodiode is connected to the third and fourth wire $12c$ and $12d$, so that the two diodes are not connected to the same wires. An advantage of this embodiment is the greater area over which to place contacts $28a$ and $28b$. Each photodiode $2a$ and $2b$ has three quadrants in which contacts can be located to connect to the appropriate metal wires $12a$, $12b$, $12c$ and $12d$. In a straight row or column, only two quadrants per diode can be used for connecting to the wires, while keeping the signals from neighboring diodes separated.

Figure 4:
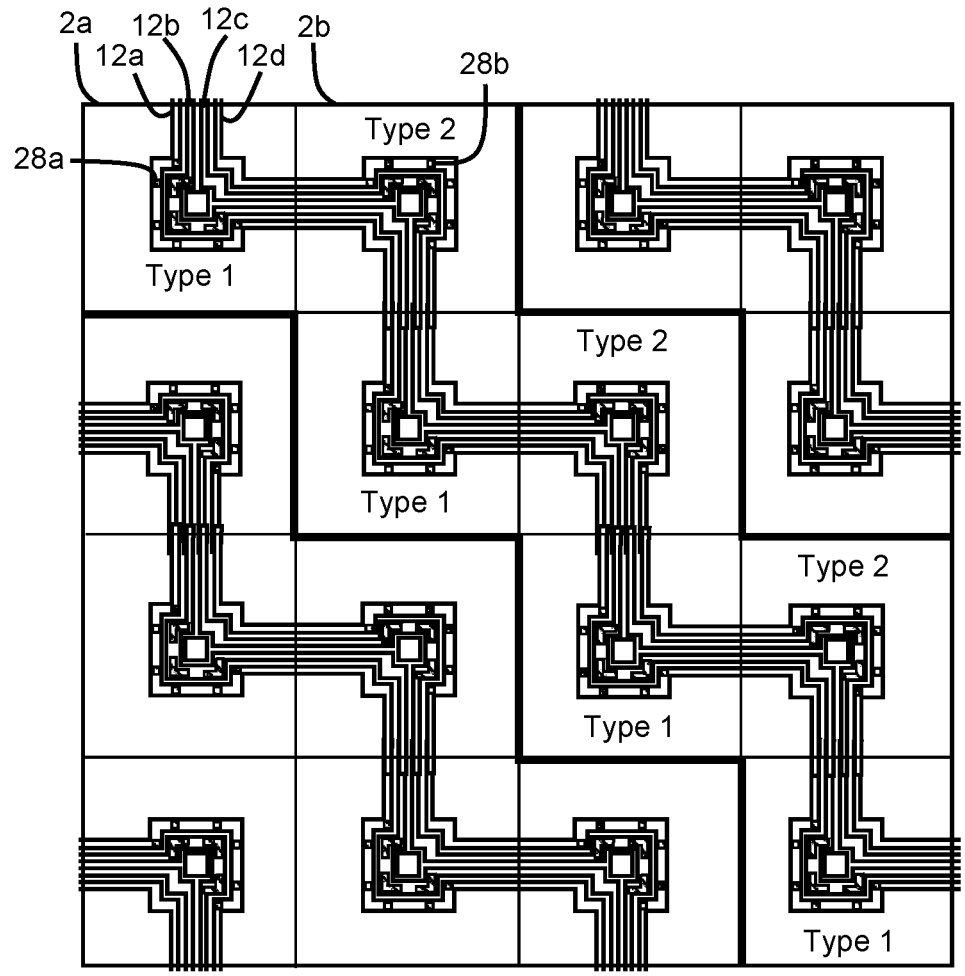
FIG. 4 shows a schematic top view cross section of a part of an optical sensor according to another embodiment, wherein the photodiodes in the array are arranged in stepped diagonal lines.

FIG. 4 shows an array of photodiodes 30 comprising photodiodes of two types (Type 1 and Type 2). The array comprises a first photodiode $2a$ of the first type (Type 1) and a second photodiode $2b$ of the second type (Type 2), which may be the first and second photodiodes $2a$ and $2b$ shown in FIG. 3. Photodiodes of the first type (Type 1) comprise contacts $28a$ connecting to a first and second metal wire $12a$ and $12b$. Photodiodes of the second type (Type 2) comprise contacts $28b$ connecting to a third and fourth metal wire $12c$ and $12d$. The metal wires $12a$, $12b$, $12c$ and $12d$ run diagonally through the array and are located in the same metal layer (typically Metal 1). Each diagonal "stair" of photodiodes in the array can carry two signals. Each photodiode in the array can comprise a light shield (not shown) for shielding the peripheral region of each diode from light.

Figure 5:
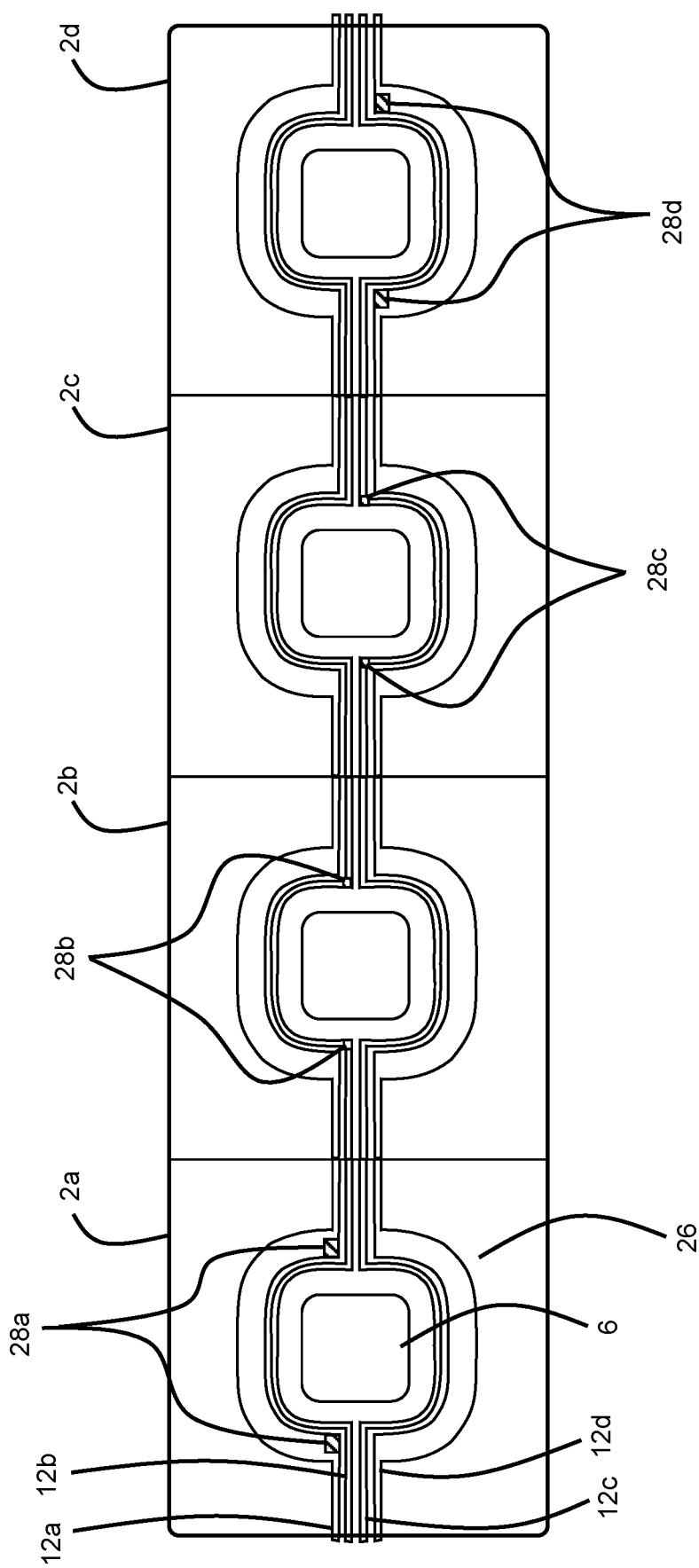
FIG. 5 shows a schematic top view cross section of a part of an optical sensor according to another embodiment, wherein a row of four photodiodes has four separate input/output channels.

FIG. 5 shows a schematic diagram of a row of four photodiodes $2a$, $2b$, $2c$ and $2d$ in an optical sensor according to an embodiment. The row comprises four metal wires $12a$, $12b$, $12c$ and $12d$ representing four separate channels (one for each photodiode $2a$, $2b$, $2c$ and $2d$ in the row). The metal wires $12a$, $12b$, $12c$ and $12d$ are located in the same metal layer in the peripheral region 26 of each photodiode $2a$, $2b$, $2c$ and $2d$, and do not cover the optical active region 6. The first (leftmost) photodiode $2a$ comprises two contacts $28a$ connecting the first photodiode $2a$ to the first metal wire $12a$. The first photodiode $2a$ does not comprise any contacts located so as to connect to the other metal wires $12b$, $12c$ and $12d$. Hence, input and output signals to the first photodiode $2a$ are only transmitted on the first metal wire $12a$. Similarly, the second photodiode $2b$ in the row comprises contacts $28b$ connecting to the second metal wire $12b$, the third photodiode $2c$ in the row comprises contacts $28c$ connecting to the third metal wire $12c$, and the fourth (rightmost) photodiode $2d$ comprises contacts $28d$ connecting to the fourth metal wire $12d$. Hence, each photodiode $2a$, $2b$, $2c$ and $2d$ in the row has a dedicated metal wire $12a$, $12b$, $12c$ and $12d$, which is determined by the placement of contacts $28a$, $28b$, $28c$ and $28d$.

In general, embodiments described herein provide an optical sensor comprising an array of photodiodes comprising a first and a second photodiode, each comprising an optical active region surrounded by a peripheral region, and a metal layer comprising a plurality of metal wires, each metal wire being located in the peripheral region of the first photodiode and located in the peripheral region of the second photodiode, wherein the first photodiode is connected to a first subset of metal wires of the plurality of metal wires and wherein the second photodiode is connected to a second, different subset of metal wires of the plurality of metal wires. A subset of metal wires comprises one or more metal wires. The embodiments can thereby provide a layout of metal wires in the same metal layer which allow signals from each photodiode to be routed past other photodiodes in e.g. a row or column of the array. In certain embodiments, the photodiodes are directly contacted to the metal wires, without any transistors or other intermediate devices.

The optical sensor may comprise a third photodiode next to the second photodiode and electrically connected to the first subset of metal wire but not to the second subset of metal wires. The optical sensor may also comprise a fourth photodiode next to the third photodiode and electrically connected to the second subset of metal wires but not to the first subset of metal wires. In this case, every other photodiode in a row or column are connected to together and provide summed output signals. For example, an 8×8 array may comprise four channels in each row, wherein each channel is associated with two photodiodes in the row.

Alternatively, each photodiode in a row or column may have a separate channel (i.e. a separate subset of metal wires for inputs and outputs). The optical sensor may comprise a third photodiode next to the second photodiode and electrically connected to a third subset of metal wires of the plurality of metal wires different from the first and second subsets of metal wires, wherein the third subset of metal wires is located in the peripheral regions of the first, second and third photodiodes. The optical sensor may further comprise a fourth photodiode next to the third photodiode and electrically connected to a fourth subset of metal wires of the plurality of metal wires different from the first, second and third subsets of metal wires, wherein the fourth subset of metal wires is located in the peripheral regions of the first, second, third and fourth photodiodes.

The first, second and third photodiodes may be arranged in a row or a column or in a stepped diagonal. In each case, metal wires connecting to one of the photodiodes has to run past the other two photodiodes, since the metal wires are constrained to one metal layer. When the photodiodes are arranged in a stepped diagonal line, each photodiode may comprise contacts in three quadrants of the photodiode. The metal layer is typically the first metal layer (Metal 1) of a complementary metal oxide semiconductor (CMOS) back-end stack. The optical sensor typically comprises a second metal layer comprising a light shield. The light shield can be in Metal 2 (above Metal 1 comprising the wiring). The light shield may comprise a continuous metal layer in the peripheral region of the first photodiode, but not covering the optical active region. The sensor may further comprise an interdielectric layer under the metal layer (insulating the metal layer from the underlying silicon) and contacts in the interdielectric layer connecting the plurality of metal wires to the array of photodiodes.

Embodiments described herein also provide, a method for use in making an optical sensor, the method comprising providing an array of photodiodes comprising a first and a second photodiode, each comprising an optical active region and a peripheral region, and providing a metal layer comprising a plurality of metal wires located in the peripheral regions of the first and second photodiodes, wherein the first photodiode is connected to a first subset of metal wires of the plurality of metal wires and wherein the second photodiode is connected to a second, different subset of metal wires of the plurality of metal wires.

The step of providing an array of photodiodes may comprise providing a substrate comprising the array of photodiodes. The step of providing the metal layer may comprise depositing an interdielectric layer, forming contacts in the interdielectric layer for providing contacts to the underlying array of photodiodes, depositing the metal layer on the interdielectric layer and patterning the metal layer to form the plurality of metal wires.

The method may comprise depositing a second metal layer above the first metal layer and patterning the second metal layer to form a light shield in the peripheral region of the first photodiode and in the peripheral region of the second photodiode. The steps of depositing and patterning the metal layer are typically performed in a complementary metal oxide semiconductor (CMOS) backend of line (BEOL) process.

While specific embodiments of the invention have been described above, it will be appreciated that the invention may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

What is claimed is:

1. An optical sensor comprising:
an array of photodiodes comprising a first photodiode comprising a first optical active region surrounded by a first peripheral region and a second photodiode comprising second optical active region surrounded by a second peripheral region, wherein the first peripheral region and the second peripheral region do not overlap; and
a metal layer comprising a plurality of metal wires located in said first peripheral region and in said second peripheral region of said first and second photodiodes, wherein said first photodiode is directly electrically connected to a first subset of metal wires of said plurality of metal wires and wherein said second photodiode is directly electrically connected to a second, different subset of metal wires of said plurality of metal wires.

2. An optical sensor according to claim 1, wherein said first and second photodiodes are nearest neighbors in said array of photodiodes.

3. An optical sensor according to claim 1, further comprising a third photodiode next to said second photodiode and directly electrically connected to said first subset of metal wires but not to said second subset of metal wires.

4. An optical sensor according to claim 3, further comprising a fourth photodiode next to said third photodiode and directly electrically connected to said second subset of metal wires but not to said first subset of metal wires.

5. An optical sensor according to claim 3, wherein said first, second and third photodiodes are arranged in a row or a column.

6. An optical sensor according to claim 3, wherein said first, second and third photodiodes are arranged in a stepped diagonal line.

7. An optical sensor according to claim 1, further comprising a third photodiode next to said second photodiode and directly electrically connected to a third subset of metal wires of said plurality of metal wires different from said first and second subsets of metal wires, wherein said third subset of metal wires is located in the peripheral regions of said first, second and third photodiodes.

8. An optical sensor according to claim 7, further comprising a fourth photodiode next to said third photodiode and directly electrically connected to a fourth subset of metal wires of said plurality of metal wires different from said first, second and third subsets of metal wires, wherein said fourth subset of metal wires is located in the peripheral regions of said first, second, third and fourth photodiodes.

9. An optical sensor according to claim 1, wherein said metal layer is the first metal layer (Metal 1) of a complementary metal oxide semiconductor (CMOS) backend stack.

10. An optical sensor according to claim 1, further comprising a second metal layer comprising a light shield.

11. An optical sensor according to claim 10, wherein said light shield comprises a continuous metal layer in said first and second peripheral regions of said first and second photodiodes.

12. An optical sensor according to claim 1, further comprising an interdielectric layer and contacts in said interdielectric layer connecting said plurality of metal wires to said array of photodiodes.

* * * * *